United States Patent
Mattsson (10) Patent No.: US 11,456,102 B2
(45) Date of Patent: Sep. 27, 2022

(54) TUNABLE INDUCTOR ARRANGEMENT, TRANSCEIVER, METHOD AND COMPUTER PROGRAM

(71) Applicant: Telefonaktiebolaget LM Ericsson (publ), Stockholm (SE)

(72) Inventor: Thomas Mattsson, Limhamn (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 17/144,289

(22) Filed: Jan. 8, 2021

(65) Prior Publication Data

US 2021/0134507 A1    May 6, 2021

Related U.S. Application Data (63) Continuation of application No. 16/279,566, filed on Feb. 19, 2019, now Pat. No. 10,916,364, which is a
(Continued)

(30) Foreign Application Priority Data

Oct. 16, 2013  (EP) ...................... 13188915

(51) Int. Cl.
*H03J 3/06* (2006.01)
*H01F 27/00* (2006.01)
(Continued)

(52) U.S. Cl.
CPC ........... *H01F 27/004* (2013.01); *H01F 21/12* (2013.01); *H01F 27/2804* (2013.01);
(Continued)

(58) Field of Classification Search
CPC .. H03H 7/01; H03H 7/38; H03H 9/64; H03H 7/40; H03H 9/54; H03H 7/46; H03H 9/72;
(Continued)

(56) References Cited

U.S. PATENT DOCUMENTS

| 5,072,722 A | 12/1991 | Fockens |
| 5,351,688 A | 10/1994 | Jones |

(Continued)

FOREIGN PATENT DOCUMENTS

| CN | 1613175 A | 5/2005 |
| CN | 1950913 A | 4/2007 |

(Continued)

OTHER PUBLICATIONS

3GPP, "3rd Generation Partnership Project; Technical Specification Group Radio Access Network; Evolved Universal Terrestrial Radio Access (E-UTRA); User Equipment (UE) radio transmission and reception (Release 11)", 3GPP TS 36.101 V11.1.0, Jun. 2012, pp. 1-336.

(Continued)

*Primary Examiner* — Tu X Nguyen
(74) *Attorney, Agent, or Firm* — Murphy, Bilak & Homiller, PLLC (57) ABSTRACT

A tunable inductor arrangement includes a first winding part connected at one end to a first input of the inductor arrangement, a second winding part connected at one end to the other end of the first winding part, a third winding part connected at one end to a second input of the inductor arrangement, and a fourth winding part connected at one end to the other end of the third winding part. For tuning, the inductor arrangement includes a switch arrangement switchable between a first setting series-connecting the first and third winding parts between the inputs, and a second setting series-connecting the first, second, fourth and third winding parts between the inputs. The first and third winding parts are arranged on a chip or substrate with essentially common magnetic fields, and the second and fourth winding parts are arranged to cancel electro-magnetic coupling with the first and third winding parts.

6 Claims, 3 Drawing Sheets

Related U.S. Application Data continuation of application No. 15/911,301, filed on Mar. 5, 2018, now Pat. No. 10,249,426, which is a continuation of application No. 15/029,329, filed as application No. PCT/EP2014/071751 on Oct. 10, 2014, now Pat. No. 9,934,898.

(51) Int. Cl.

| | | |
|---|---|---|
| *H01F 21/12* | (2006.01) | |
| *H01L 23/522* | (2006.01) | |
| *H01F 27/28* | (2006.01) | |
| *H01L 49/02* | (2006.01) | |
| *H04B 1/16* | (2006.01) | |
| *H04B 1/40* | (2015.01) | |

(52) U.S. Cl.
CPC .......... *H01L 23/5227* (2013.01); *H01L 28/10* (2013.01); *H04B 1/16* (2013.01); *H04B 1/40* (2013.01); *H01F 2021/125* (2013.01); *H01L 2924/0002* (2013.01)

(58) Field of Classification Search
CPC ............ H03H 9/02; H03H 9/70; H03H 9/145; H03H 9/60; H03H 9/00; H03H 9/205; H03J 7/10; H03J 3/02; H03J 3/04; H03J 3/22; H03J 3/24; H03J 3/06; H03J 3/16; H03J 3/32; H03J 1/06; H03J 3/26; H03J 7/08; H03J 9/00; H03J 9/04; H03J 5/02; H03J 3/10; H03J 5/28; H03J 3/12
See application file for complete search history.

(56) References Cited

U.S. PATENT DOCUMENTS

| | | |
|---|---|---|
| 6,621,365 B1 | 9/2003 | Hallivuori et al. |
| 7,005,930 B1 | 2/2006 | Kim et al. |
| 7,151,430 B2 | 12/2006 | Mattsson |
| 7,432,794 B2 | 10/2008 | Mattsson |
| 8,183,971 B2 | 5/2012 | Le Guillou et al. |
| 8,331,978 B2 | 12/2012 | Cabanillas et al. |
| 8,995,935 B2 | 3/2015 | Mihota |
| 9,299,764 B2 | 3/2016 | Mattsson et al. |
| 10,121,845 B2 | 11/2018 | Mattsson et al. |
| 2005/0052272 A1 | 3/2005 | Tiebout et al. |
| 2005/0195063 A1 | 9/2005 | Mattsson |
| 2005/0237772 A1 | 10/2005 | Batarseh et al. |
| 2009/0085689 A1 | 4/2009 | Rohani et al. |
| 2009/0134954 A1 | 5/2009 | Uzunov et al. |
| 2009/0167466 A1 | 7/2009 | Qiu et al. |
| 2010/0148882 A1 | 6/2010 | Bouttement et al. |
| 2010/0164667 A1 | 7/2010 | Ho-Hsiang |
| 2010/0171557 A1 | 7/2010 | Tsukizawa |
| 2011/0006872 A1 | 1/2011 | Nazarian et al. |
| 2011/0148536 A1 | 6/2011 | Italia et al. |
| 2012/0028688 A1 | 2/2012 | Vartanian |
| 2012/0244802 A1 | 9/2012 | Feng et al. |
| 2012/0249384 A1 | 10/2012 | Kaikkonen et al. |
| 2012/0286889 A1 | 11/2012 | Park et al. |
| 2012/0302188 A1 | 11/2012 | Sahota et al. |
| 2013/0051493 A1 | 2/2013 | Mo et al. |
| 2013/0141177 A1* | 6/2013 | Narathong ........... H03B 5/1268 361/268 |
| 2013/0165058 A1 | 6/2013 | Mostafa et al. |
| 2015/0002236 A1 | 1/2015 | Wang et al. |
| 2015/0234422 A1 | 8/2015 | Bucelot et al. |

FOREIGN PATENT DOCUMENTS

| | | |
|---|---|---|
| CN | 101057391 A | 10/2007 |
| CN | 101253585 A | 8/2008 |
| CN | 101682293 A | 3/2010 |
| CN | 103227647 A | 7/2013 |
| EP | 2110821 A2 | 10/2009 |
| EP | 2863428 B1 | 5/2017 |
| EP | 2863429 B1 | 6/2017 |
| JP | 2009500860 A | 1/2009 |
| RU | 92273 U1 | 3/2010 |
| RU | 2012122227 A | 12/2013 |
| RU | 2517059 C2 | 5/2014 |
| WO | 03038999 A1 | 5/2003 |
| WO | 03052780 A1 | 6/2003 |
| WO | 2007006867 A1 | 1/2007 |
| WO | 2009081342 A1 | 7/2009 |

OTHER PUBLICATIONS

Deng, Wei, et al., "A 25MHz-6.44GHz LC-VCO Using a 5-port Inductor for multi-band Frequency Generation", Department of Physical Electronics, Tokyo Institute of Technology, Tokyo, Japan, 2011, 4 pages.

Tesson, O, "High Quality Monolithic 8-shaped Inductors for Silicon RF IC Design", IEEE, NXP Semiconductors, Campus EffiScience, Colombelles, France, 2008, 4 pages.

\* cited by examiner

TUNABLE INDUCTOR ARRANGEMENT, TRANSCEIVER, METHOD AND COMPUTER PROGRAM

RELATED APPLICATIONS

This application is a continuation of U.S. application Ser. No. 16/279,566 filed 19 Feb. 2019, which is a continuation of U.S. application Ser. No. 15/911,301 filed 5 Mar. 2018, now U.S. Pat. No. 10,249,426, which is a continuation of U.S. application Ser. No. 15/029,329 filed 14 Apr. 2016, now U.S. Pat. No. 9,934,898, which is a U.S. National Phase Application of PCT/EP2014/071751 filed 10 Oct. 2014, which claims priority of EP13188915.6 filed 16 Oct. 2013. The entire contents of each aforementioned application is incorporated herein by reference.

TECHNICAL FIELD

The present invention generally relates to a tunable inductor arrangement, a radio frequency transceiver or receiver with a resonator having such an arrangement, a communication device, a method of tuning the arrangement and a computer program for tuning.

BACKGROUND

As more bands are to be supported in radio transceivers, which bands may span over a wide frequency range such as from 700 MHz to 3800 MHz, this can be met by a set of resonators. It is known that tuning an LC (inductor-capacitor) resonator more than one octave is difficult, which gives that a multitude of resonators may be demanded. This problem is further emphasized when carrier aggregation, i.e. the communication is performed on several different carriers simultaneously, which carriers may be spread anywhere in the wide frequency range.

LC resonators consume chip space, when implemented on-chip, and are fairly costly when implemented off-chip. It is therefore a desire to provide more flexible resonators.

SUMMARY

An object of the invention is to at least alleviate the above stated problem. The present invention is based on the understanding that both capacitance and inductance of an LC resonator need to be tuned to achieve the desired flexibility. A tunable inductor arrangement is provided accordingly. The inventor has also realized the demands that the self-resonant frequency need to be set high enough for high-frequency modes, the Q-value has to be high enough, particularly in low-inductance state, not to degrade gain or increase current consumption in a usable implementation, and that the ratio of the inductances need to be high enough to also cover the low bands. This is achieved by a switch arrangement in the tunable inductor arrangement which performs signal routing such that insertion loss is decreased, particularly in unused circuitry.

According to a first aspect, there is provided a tunable inductor arrangement arrangable on a chip or substrate, the tunable inductor comprising a first winding part connected at a first end to a first input of the tunable inductor arrangement; a second winding part connected at a first end to a second end of the first winding part; a third winding part connected at a first end to a second input of the tunable inductor arrangement; a fourth winding part connected at a first end end to a second end of the third winding part and at a second end connected towards a second end of the second winding part; and a switch arrangement arranged to tune the tunable inductor arrangement by selectively provide at least: a circuit comprising the first and third winding parts in series between the first and second inputs; and a circuit comprising the first, second, fourth and third winding parts in series between the first and second inputs. The first and third winding parts are arranged on the chip or substrate such that magnetic fields of the first and third winding parts are essentially common, and the second and fourth winding parts are arranged to cancel electro-magnetic coupling with the first and third winding parts.

The fourth winding part may be connected at the second end to the second end of the second winding part.

The tunable inductor arrangement may comprise further winding parts connected between the second end of the fourth winding part and the second end of the second winding part.

The switch arrangement may comprise a first switch connected between the second end of the first winding part and the second end of the third winding part.

The switch arrangement may comprise a first switch connected between the second end of the first winding part and a virtual ground connected to the second end of the second winding part; and a second switch connected between the second end of the third winding part and the virtual ground.

The second and fourth winding parts may form a pattern on the chip or substrate having a first part directing the magnetic field in a first direction and a second part directing the magnetic field in a second direction, wherein the second direction is opposite to the first direction. The pattern of the second and fourth winding parts and the pattern of the first and third winding parts may be symmetrically arranged on the chip or substrate. The first and third winding parts may form a pattern encircling the second and fourth winding parts in a plane of the chip or substrate.

The pattern of the second and fourth winding parts may be eight-shaped, four-clover-shaped, or 2n-clover-shaped, where n is a positive integer.

Two or more of the winding parts may be arranged in a plurality of conductive layers on the chip or substrate.

The virtual ground may be a DC power supply, which at AC, such as radio frequency, acts as a ground for AC signals, or be a ground or DC reference voltage node.

According to a second aspect, there is provided a radio frequency transceiver comprising a resonator, wherein the resonator comprises a tunable inductor arrangement according to the first aspect, wherein the tunable inductor arrangement is tunable to enable the resonator to selectably work at one of a plurality of resonating frequencies.

According to a third aspect, there is provided a multiband radio frequency receiver comprising a first receiver path arranged to receive a radio signal in a first frequency band; a second receiver path arranged to receive a radio signal in a second frequency band, wherein the first frequency band operates at a higher frequency than the second frequency band, and each of the first and second receiver paths is arranged to selectively operate at a selected frequency band among a plurality of frequency bands; and comprises a resonator comprising a tunable inductor arrangement according to the first aspect, which resonator is arranged to be tuned for the selected frequency band.

According to a fourth aspect, there is provided a communication device comprising a radio frequency transceiver according to the second aspect or a multiband radio frequency receiver according to the third aspect, and a processor arranged to interact with the radio frequency transceiver or the multiband radio frequency receiver, wherein the processor is arranged to control to the switch arrangement to select a tuning mode of the tunable inductor arrangement.

According to a fifth aspect, there is provided a method of a tunable inductor arrangement including winding parts and switches for tuning according to the first aspect. The method comprises determining a tuning setting for the tunable inductor arrangement; assigning switch states for the switch or respective switches for the tuning setting; and controlling the switch or switches according to the assigned switch states.

According to a sixth aspect, there is provided a computer program comprising computer executable instructions which when executed by a programmable controller of a radio frequency transceiver or multiband radio frequency receiver comprising a resonator which comprises a tunable inductor arrangement causes the controller to perform the method of the fifth aspect.

An advantage is achieved for embodiments when Q-value increases with frequency, with a layout that provides higher Q-value in low inductance state than in high inductance state, and absolute resonator bandwidth becomes more constant over frequency.

An advantage according to embodiments is that a tunable resonator allows a more flexible configuration of a multiband receiver/transmitter/transceiver. For example, different receiver paths no longer need to be dedicated to either low band or high band, but can be allocated depending on current reception situation.

Other objectives, features and advantages of the present invention appear from the following detailed disclosure, from the attached dependent claims as well as from the drawings. Generally, all terms used in the claims are to be interpreted according to their ordinary meaning in the technical field, unless explicitly defined otherwise herein. All references to "a/an/the [element, device, component, means, step, etc]" are to be interpreted openly as referring to at least one instance of said element, device, component, means, step, etc., unless explicitly stated otherwise. The steps of any method disclosed herein do not have to be performed in the exact order disclosed, unless explicitly stated.

Of course, the present invention is not limited to the above features and advantages. Those of ordinary skill in the art will recognize additional features and advantages upon reading the following detailed description, and upon viewing the accompanying drawings.

BRIEF DESCRIPTION OF THE DRAWINGS

The above, as well as additional objects, features and advantages of the present invention, will be better understood through the following illustrative and non-limiting detailed description of preferred embodiments of the present invention, with reference to the appended drawings.

DETAILED DESCRIPTION

Figure 1:
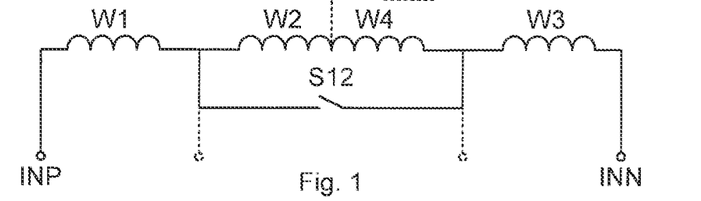
FIG. 1 schematically illustrates a tunable inductor arrangement according to an embodiment.

FIG. 1 schematically illustrates a tunable inductor arrangement according to an embodiment. The inductor arrangement is preferably arranged on a chip or substrate, as will be demonstrated below. The inductor arrangement comprises a first winding part W1 connected at one end to a first input INP of the tunable inductor arrangement, a second winding part W2 connected at one end to the other end of the first winding part W1, a third winding part W3 connected at one end to a second input INN of the tunable inductor arrangement, and a fourth winding part W4 connected at one end to the other end of the third winding part W3 and at another end connected to the other end of the second winding part W2. The point where the second and fourth winding parts W2, W4 joints can optionally be connected to an AC ground, e.g. to supply voltage, as a centre tap. A series connection of the winding parts W1, W2, W4, W3 is thus inherently formed. The tunable inductor arrangement further comprises a switch arrangement arranged to tune the tunable inductor arrangement by selectively provide either the series connection or a circuit comprising the first and third winding parts W1, W3 in series between the first and second inputs INP, INN. The winding parts are arranged on a chip or substrate, i.e. essentially in one plane, but the windings may be formed in two or more metal layers, wherein the windings can be stacked on the chip or substrate or arranged side-by-side in a metal layer, or a combination thereof. The switch arrangement comprises a switch S12 connected between the other end of the first winding part W1 and the other end of the third winding part W3. When the switch S12 is open, the series connection of the winding parts W1, W2, W4, W3 is operable, while when the switch S12 is closed, the circuit comprising the first and third winding parts W1, W3 in series is operable between the first and second inputs INP, INN. When in the state where only the first and third winding parts W1, W3 are operable, it is desirable that the inoperable second and fourth windings W2, W4 do not influence, e.g. to keep insertion loss low. Therefore, the first and third winding parts are arranged on the chip or substrate such that magnetic fields of the first and third windings are essentially common, and the second and fourth winding parts are arranged to cancel electro-magnetic coupling with the first and third winding parts. This can be arranged by a winding structure that cancels magnetic coupling between the first/third and the second/fourth windings, as will be demonstrated by example with reference to FIG. 3 below. The principle can be accomplished by the second and fourth winding parts form a pattern on the chip or substrate having a first part directing the magnetic field in a first direction and a second part directing the magnetic field in a second direction, wherein the second direction is opposite to the first direction. The magnetic coupling is thereby cancelled. It is to be noted that the centre tap is connected to the supply node in the low-impedance mode, and when the switch S12 is closed there are paths from the first and third windings parts W1, W3 to the centre tap node via the short-circuited second and fourth winding parts W2, W4. The impedance or resistance is reasonably increased, but is providing a working solution for many applications.

Figure 2:
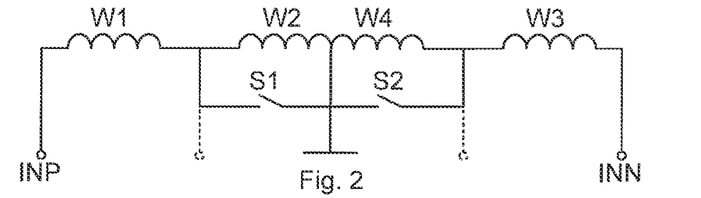
FIG. 2 schematically illustrates a tunable inductor arrangement according to an embodiment.

FIG. 2 schematically illustrates a tunable inductor arrangement according to an embodiment. The inductor arrangement is preferably arranged on a chip or substrate, as will be demonstrated below. The inductor arrangement comprises a first winding part W1 connected at one end to a first input INP of the tunable inductor arrangement, a second winding part W2 connected at one end to the other end of the first winding part W1, a third winding part W3 connected at one end to a second input INN of the tunable inductor arrangement, and a fourth winding part W4 connected at one end to the other end of the third winding part W3 and at another end connected to the other end of the second winding part W2. The point where the second and fourth winding parts W2, W4 joints is connected to an AC ground, e.g. to supply voltage, as a centre tap. A series connection of the winding parts W1, W2, W4, W3 is thus inherently formed. The tunable inductor arrangement further comprises a switch arrangement arranged to tune the tunable inductor arrangement by selectively provide either the series connection or a circuit comprising the first and third winding parts W1, W3 in series between the first and second inputs INP, INN. The winding parts are arranged on a chip or substrate, i.e. essentially in one plane, but the windings may be formed in two or more metal layers, wherein the windings can be stacked on the chip or substrate or arranged side-by-side in a metal layer, or a combination thereof. The switch arrangement comprises a first switch S1 connected between the other end of the first winding part W1 and the AC ground, i.e. to the centre tap. A second switch S2 is connected between the centre tap and the other end of the third winding part W3. When the switches S1 and S2 are open, the series connection of the winding parts W1, W2, W4, W3 is operable, while when the switches S1 and S2 are closed, the circuit comprising the first and third winding parts W1, W3 in series is operable between the first and second inputs INP, INN. The AC connection provided in the open state by the centre tap is in the closed state still provided via the switches S1, S2. Here, the dual switch arrangement provides a lower impedance path to the centre tap compared to the embodiment demonstrated with reference to FIG. 1, but may be to a cost of higher parasitic capacitances. When in the state where only the first and third winding parts W1, W3 are operable, it is desirable that the inoperable second and fourth windings W2, W4 do not influence, e.g. to keep insertion loss low. Therefore, the first and third winding parts are arranged on the chip or substrate such that magnetic fields of the first and third windings are essentially common, and the second and fourth winding parts are arranged to cancel electro-magnetic coupling with the first and third winding parts. This can be arranged by a winding structure that cancels magnetic coupling between the first/third and the second/fourth windings, as will be demonstrated by example with reference to FIG. 3 below. The principle can be accomplished by the second and fourth winding parts form a pattern on the chip or substrate having a first part directing the magnetic field in a first direction and a second part directing the magnetic field in a second direction, wherein the second direction is opposite to the first direction. The magnetic coupling is thereby cancelled. By using two switches S1, S2 connected to the centre tap, lower impedance connection to the supply node is achieved, which may be important for some applications. On the other hand, the more complex switch arrangement may result in more parasitic resistance and/or capacitance, which may degrade resonator performance in some applications.

Figure 3:
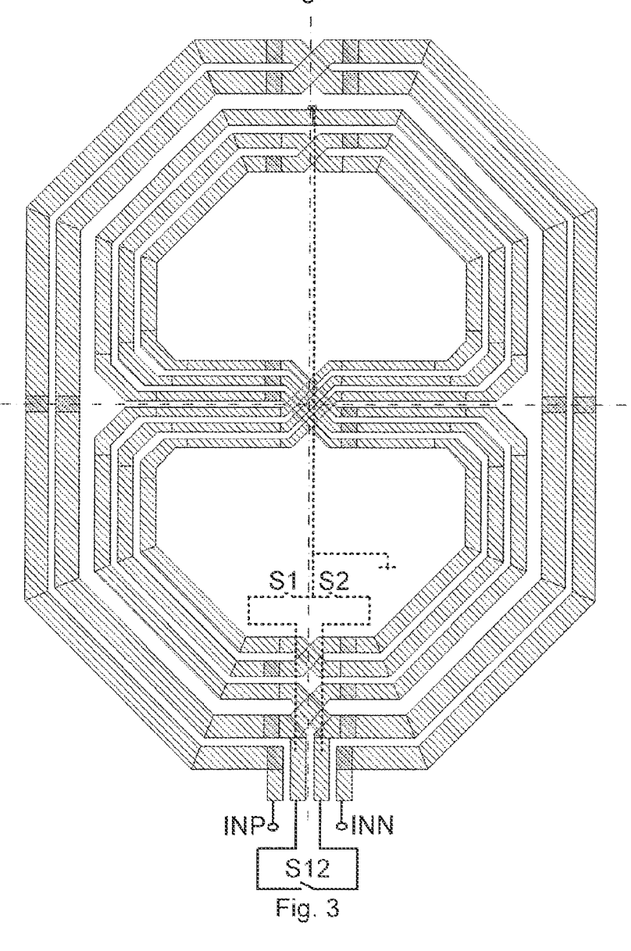
FIG. 3 illustrates a layout of windings of a tunable inductor arrangement together with a schematic indication on the switch arrangement according to embodiments.

FIG. 3 illustrates an example of layout of windings of a tunable inductor arrangement together with a schematic indication on the switch arrangement according to embodiments, where the respective switch arrangements demonstrated with reference to FIGS. 1 and 2 are schematically illustrated in FIG. 3. The first and third winding parts form a pattern encircling the second winding in a plane of the chip or substrate. The pattern of the second and fourth winding parts and the pattern of the first and third winding parts are symmetrically arranged on the chip or substrate, as emphasized by symmetry lines provided in FIG. 3. The pattern of the second and fourth winding parts is eight-shaped in FIG. 3, which provides for a first part directing the magnetic field in a first direction and a second part directing the magnetic field in a second direction, wherein the second direction is opposite to the first direction. Other patterns providing the same effect are equally possible, e.g. four-clover-shaped, or 2n-clover-shaped, where n is a positive integer.

Figure 4:
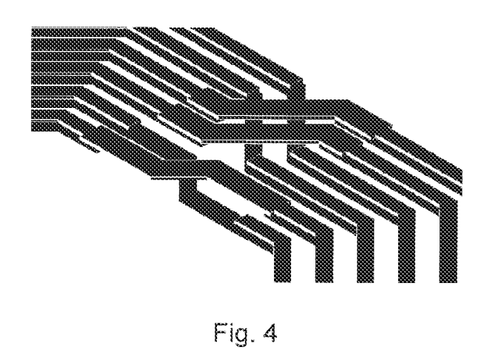
FIG. 4 illustrates a detail of a layout of windings of a tunable inductor arrangement according to an embodiment.

FIG. 4 illustrates a detail of an example of layout of windings of a tunable inductor arrangement according to an embodiment. Crossings of conductive lanes forming the windings can thus be achieved. Two or more of the winding parts can be arranged in a plurality of conductive layers on the chip or substrate. In the illustrations, the lanes are provided side by side on the substrate and the crossings using layered conductors. However, the lanes can also use layered conductors and be placed on top of each other, or a combination of be provided in different layers and side by side. The shape of the windings have also been illustrated as octagons, but other shapes are as feasible, such as circular, square, or other n-sided shape, where n is 3 or higher, or combinations thereof, which form windings enclosing a magnetic field which is the purpose of the windings to form an inductance. The inductance can be adapted for differential purposes or single-ended purposes in conventional way.

Further winding parts can be connected between the second and fourth winding parts W2, W4, which can be included in forming a circuit of the tunable inductor arrangement. Such further winding parts are preferably also arranged on the chip or substrate such that magnetic fields for cancelling electro-magnetic coupling with the first to fourth winding parts W1-W4 similar to the relation between the second and fourth winding parts W2, W4 to the first and third winding parts W1, W3. This can be enabled by applying further metal layers for implementing the winding parts on the chip or substrate, and further switches of the switch arrangement for selectively provide circuits including a desired amount of winding parts.

Figure 5:
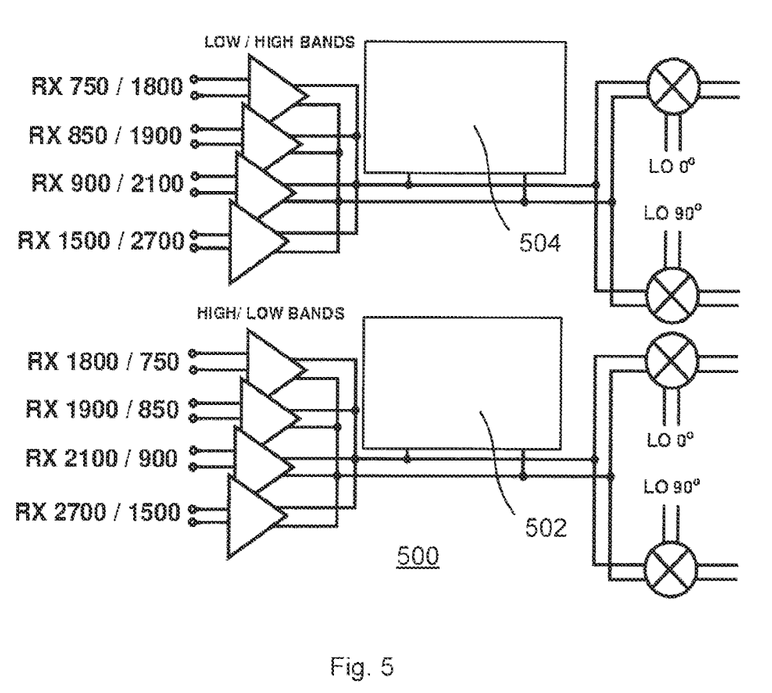
FIG. 5 schematically illustrates a radio front end where the tunable inductor arrangements according to embodiments are applicable.

FIG. 5 schematically illustrates a radio front end where the tunable inductor arrangements according to embodiments are applicable. In a radio front end circuit used for example in a 3GPP LTE radio, a multitude of bands may be used. Further, if for example carrier aggregation where separate bands are collected and used simultaneously in different configurations, versatility is a key to a feasible front end solution. Still further, if the front end should be usable for other radio access technologies as well, such as GSM, UMTS, WLAN, GNSS, etc., the demands on versatility further increases. The received signal can thus be in a multitude of frequencies and having wide or narrow bandwidth, and for example a band selection filter, or other circuit that need a resonator, may need to be configurable for this depending on current operating mode. Variable capacitance in such band selection filters normally do a lot, e.g. by using capacitor banks where capacitance can be switched in on demand, but by using a tunable inductor as demonstrated above, versatility can be improved, as well as performance of for example the band selection filters. By using one or more tunable inductor arrangements 502, 504 as those demonstrated above, the demands on versatility can be met. Flexible band combinations are thereby enabled.

An example where the front end arrangement as demonstrated above can be used is a multiband radio frequency receiver 500. The receiver 500 comprises a first receiver path arranged to receive a radio signal in a first frequency band and a second receiver path arranged to receive a radio signal in a second frequency band, wherein the first frequency band operates at a higher frequency than e second frequency band, i.e. a high-low band arrangement where both the high and the low bands can be received simultaneously. Each of the first and second receiver paths can be arranged to selectively operate at a selected frequency band among a plurality of frequency bands, e.g. the first high-band path can select to operate in one of 1800 MHz, 1900 MHz, 2100 MHz and 2700 MHz frequency bands while the second low-band path can select to operate in one of 750 MHz, 850 MHz, 900 MHz and 1500 MHz frequency bands simultaneously. These frequency bands are only demonstrated as examples, and other frequency bands and groupings between high and low frequency bands are equally possible. Each receiver path comprises a resonator comprising a tunable inductor arrangement 502, 504 as demonstrated above, wherein the resonators are arranged to be tuned for the selected frequency band in respective receiver path. It is to be noted that both receiver paths are tunable to all frequency bands by the approach of the tunable inductor arrangement, wherein great flexibility is achieved since there is no dedicated path for the higher or lower bands. Arrangements with more than two such receiver paths are also possible. Flexible frequency band combinations are thus enabled, which for example is advantageous in carrier aggregation solutions.

In FIG. 5, the resonators are illustrated for tuning LNA outputs as an example. The resonator with tunable inductor arrangement can of course be used for other purposes as well, such as for filters, impedance matching, etc.

Figure 6:
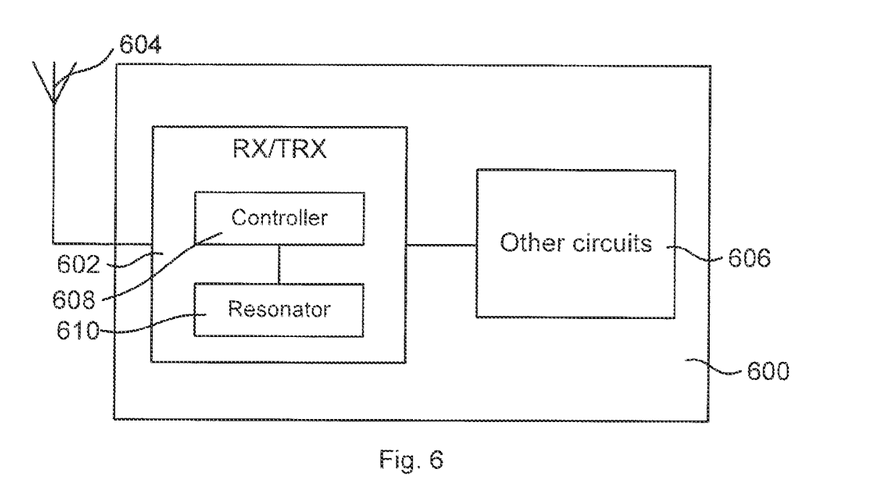
FIG. 6 is a block diagram schematically illustrating a communication device according to an embodiment.

FIG. 6 is a block diagram schematically illustrating communication device 600 according to an embodiment. The communication device comprises a receiver or transceiver 602, which can be connected to an antenna 604, and other circuits 606 such as a processor arranged interact with the receiver or transceiver 602, input and output interfaces of the communication device 600, etc. The receiver or transceiver 602 comprises a resonator 610, wherein the resonator comprises a tunable inductor arrangement according to any one of embodiments demonstrated above, wherein the tunable inductor arrangement is tunable to enable the resonator 610 to work at a plurality of resonating frequencies. The receiver or transceiver can also comprise a controller 608 which can be arranged to control the tuning of the resonator 610, i.e. also the tunable inductor arrangement. The receiver 602 can for example be the multiband radio frequency receiver 500 demonstrated with reference to FIG. 5.

Figure 7:
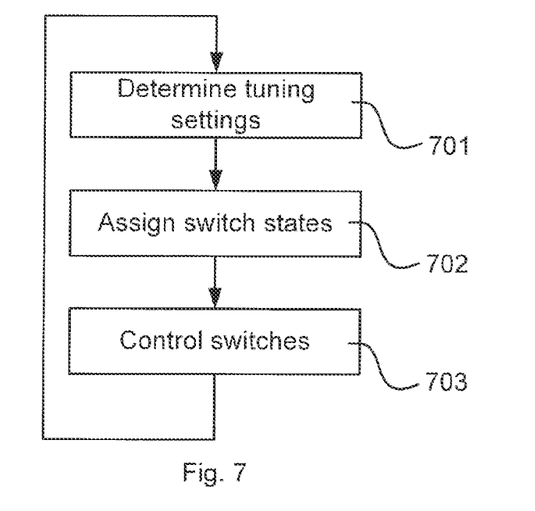
FIG. 7 is a flow chart schematically illustrating a method of a tunable inductor arrangement according to an embodiment.

FIG. 7 is a flow chart schematically illustrating a method of a tunable inductor arrangement according to an embodiment. The method comprises determining 701 a tuning setting for the tunable inductor arrangement. This can be made by receiving frequency allocation from a remote entity or from an entity within a communication apparatus having the tunable inductor arrangement. Based on for example the frequency allocation information switch states are assigned 702 for the switch S12 or respective switches S1, S2 for the tuning setting, and controlling 703 the switches according to the assigned switch states. Upon a new allocation, the procedure can be repeated.

Figure 8:
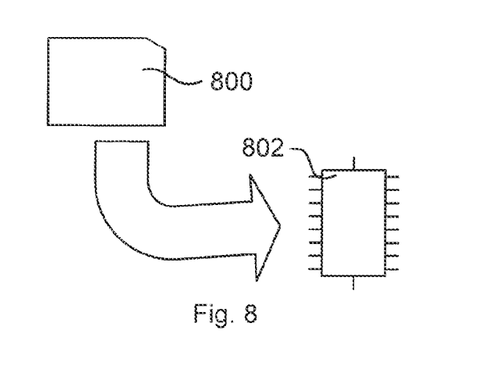
FIG. 8 schematically illustrates a computer program and a processor for implementing the method.

The method according to the present invention is suitable for implementation with aid of processing means, such as computers and/or processors, especially for the case where a digital controller controls the transceiver. Therefore, there is provided computer programs, comprising instructions arranged to cause the processing means, processor, or computer to perform the steps of any of the methods according to any of the embodiments described with reference to FIG. 7. The computer programs preferably comprises program code which is stored on a computer readable medium 800, as illustrated in FIG. 8, which can be loaded and executed by a processing means, processor, or computer 802 to cause it to perform the methods, respectively, according to embodiments of the present invention, preferably as any of the embodiments described with reference to FIG. 7. The computer 802 and computer program product 800 can be arranged to execute the program code sequentially where actions of the any of the methods are performed stepwise. The processing means, processor, or computer 802 is preferably what normally is referred to as an embedded system. Thus, the depicted computer readable medium 800 and computer 802 in FIG. 8 should be construed to be for illustrative purposes only to provide understanding of the principle, and not to be construed as any direct illustration of the elements.

The invention has mainly been described above with reference to a few embodiments. However, as is readily appreciated by a person skilled in the art, other embodiments than the ones disclosed above are equally possible within the scope of the invention, as defined by the appended patent claims.

What is claimed is:

1. A tunable inductor arrangement comprising:
   a plurality of winding parts in a series arrangement between first and second inputs of the tunable inductor arrangement, the plurality of winding parts comprising:
      a first end winding part connected to the first input;
      a second end winding part connected to the second input; and
      a plurality of further winding parts disposed in series between the first and second end winding parts; and
   a switch arrangement configured to selectively short, as shorted winding parts, the plurality of further winding parts, for selecting between a first effective inductor having a first inductance and a second effective inductor having a second inductance that is reduced in comparison to the first inductance; and
   wherein a spatial arrangement of the plurality of winding parts cancels electromagnetic coupling between the plurality of further winding parts and the first and second end winding parts, and wherein the spatial arrangement makes magnetic fields of the plurality of further winding parts cancel.

2. The tunable inductor arrangement of claim 1, wherein the switch arrangement comprises a first switch connected such that the first switch shorts the plurality of further winding parts when closed, such that the second effective inductor comprises the first end winding part in series with the second end winding part.

3. A radio frequency transceiver comprising a resonator, wherein the resonator comprises the tunable inductor arrangement of claim 1, wherein tuning of the tunable inductor arrangement by selecting the first effective inductor or the second effective inductor enables the resonator to selectably work at one of a plurality of resonating frequencies.

4. A communication device comprising the radio frequency transceiver of claim 3, and a processor arranged to interact with the radio frequency transceiver, wherein the processor is arranged to control to the switch arrangement to select a tuning mode of the tunable inductor arrangement by controlling whether the first effective inductor or the second effective inductor is selected.

5. A multiband radio frequency receiver comprising:
a first receiver path arranged to receive a radio signal in a first frequency band; and
a second receiver path arranged to receive a radio signal in a second frequency band;
wherein the first frequency band operates at a higher frequency than the second frequency band; and
wherein each of the first and second receiver paths is arranged to selectively operate at a selected frequency band among a plurality of frequency bands and comprises a resonator comprising the tunable inductor arrangement of claim 1, which resonator is arranged to be tuned for the selected frequency band.

6. A communication device comprising the multiband radio frequency receiver of claim 5, and a processor arranged to interact with the multiband radio frequency receiver, wherein the processor is arranged to control to the switch arrangement to select a tuning mode of the tunable inductor arrangement by controlling whether the first effective inductor or the second effective inductor is selected.

* * * * *

UNITED STATES PATENT AND TRADEMARK OFFICE
CERTIFICATE OF CORRECTION

PATENT NO. : 11,456,102 B2
APPLICATION NO. : 17/144289
DATED : September 27, 2022
INVENTOR(S) : Thomas Mattsson It is certified that error appears in the above-identified patent and that said Letters Patent is hereby corrected as shown below:

In the Specification

In Column 1, Line 8, delete "2019," and insert -- 2019, now U.S. Pat. No. 10,916,364, --, therefor.

In Column 2, Line 42, delete "lavers" and insert -- layers --, therefor.

In Column 3, Line 32, delete "invention appear" and insert -- invention will appear --, therefor.

In Column 6, Line 28, delete "combination of be" and insert -- combination of both may be --, therefor.

In Column 7, Line 11, delete "than e" and insert -- than the --, therefor.

In the Claims

In Column 9, Line 7, in Claim 4, delete "control to the switch" and insert -- control the switch --, therefor.

In Column 9, Lines 27-28, in Claim 6, delete "control to the switch" and insert -- control the switch --, therefor.

Signed and Sealed this
Sixth Day of June, 2023

Katherine Kelly Vidal
*Director of the United States Patent and Trademark Office*